(12) United States Patent
Tabrizian et al.

(10) Patent No.: US 10,586,135 B2
(45) Date of Patent: Mar. 10, 2020

(54) NANO-ELECTRO-MECHANICAL LABELS AND ENCODER

(71) Applicant: UNIVERSITY OF FLORIDA RESEARCH FOUNDATION, INC., Gainesville, FL (US)

(72) Inventors: Roozbeh Tabrizian, Gainesville, FL (US); Swarup Bhunia, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/011,509

(22) Filed: Jun. 18, 2018

(65) Prior Publication Data

US 2019/0188546 A1    Jun. 20, 2019

Related U.S. Application Data

(60) Provisional application No. 62/520,735, filed on Jun. 16, 2017.

(51) Int. Cl.

| | |
|---|---|
| *G06K 19/06* | (2006.01) |
| *G06K 19/04* | (2006.01) |
| *G06K 1/12* | (2006.01) |
| *H01L 41/314* | (2013.01) |
| *H01L 41/187* | (2006.01) |
| *H01L 41/09* | (2006.01) |
| *G06K 19/067* | (2006.01) |

(52) U.S. Cl.
CPC ........... *G06K 19/041* (2013.01); *G06K 1/121* (2013.01); *G06K 19/0675* (2013.01); *H01L 41/09* (2013.01); *H01L 41/187* (2013.01); *H01L 41/314* (2013.01); *G06K 2019/06234* (2013.01)

(58) Field of Classification Search
CPC . G06K 19/066037; G06K 7/14; G06K 7/1417
USPC .......................................................... 235/494
See application file for complete search history.

(56) References Cited

U.S. PATENT DOCUMENTS

| | | | |
|---|---|---|---|
| 2004/0065154 A1* | 4/2004 | Kibblewhite | ........... F16B 31/02 73/761 |
| 2015/0042702 A1* | 2/2015 | Jiang | .................... G09G 3/3413 345/694 |
| 2018/0276682 A1* | 9/2018 | Afzali-Ardakani | .......................... G06Q 30/0185 |
| 2019/0034773 A1* | 1/2019 | Vosoogh-Grayli | .......................... G06K 7/10722 |

* cited by examiner

*Primary Examiner* — Ahshik Kim
(74) *Attorney, Agent, or Firm* — Alston & Bird LLP

(57) ABSTRACT

Data is encoded for identification and labeling using a multitude of nano-electro-mechanical structures formed on a substrate. The number of such structures, their shapes, choice of materials, the spacing therebetween and the overall distribution of the structures result in a vibrational pattern or an acoustic signature that uniquely corresponds to the encoded data. A first group of the structures is formed in conformity with the design rules of a fabrication process used to manufacture the device that includes the structures. A second group of the structures is formed so as not to conform to the design rules and thereby to undergo variability as a result of the statistical variations that is inherent in the fabrication process.

29 Claims, 4 Drawing Sheets

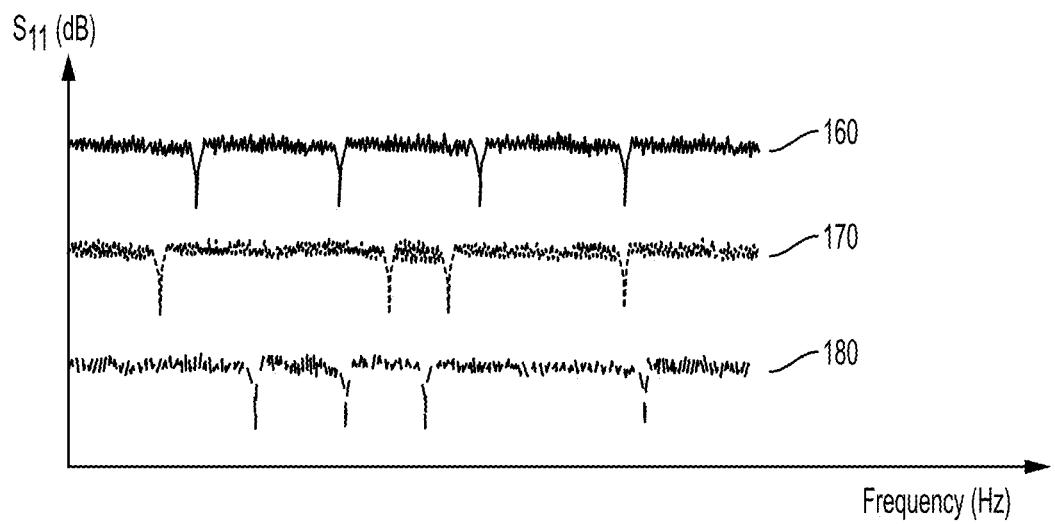
Figure 4
   
Figure 5A     Figure 5B     Figure 5C     Figure 5D

NANO-ELECTRO-MECHANICAL LABELS AND ENCODER

CROSS REFERENCE TO RELATED APPLICATIONS

The present application claims benefit under 35 USC 119(e) of Application Ser. No. 62/520,735 filed Jun. 16, 2017, the content of which is incorporated herein by reference in its entirety.

FIELD OF THE INVENTION

The present invention relates to coding of data, and more particularly to nano-electro-mechanical coding of data.

BACKGROUND

Barcodes and unique identifiers, such as radio frequency identification devices (RFIDs), are used in numerous applications from tollways to consumer sales. However, a need continues to exist for less expensive, tamper-proof, data identifiers and coding systems that have a smaller form factor and are easier to read than conventional systems.

SUMMARY OF THE INVENTION

Embodiments of the present invention provide labeling, coding and identification methods and devices. In one embodiment, a code may include a substrate and a layer of identification structures of micrometer or nanometer dimensions (referred to herein alternatively as nanodots) formed on the substrate. A layer of material, such as a polymer, may be deposited on the substrate as a preparation layer to enable the nanodots to adhere to the surface. The nanodots may form any number of patterns, such as circular, stripe and square patterns. A piezoelectric layer maybe applied to cover the nanodots partially or fully. An interdigital transducer (IDT) layer may be formed above or below the piezoelectric layer to recover electromagnetic (EM) energy. A passivation and/or protective layer may be included above the nanodots to increase the robustness of the device and prevent tampering.

Embodiments of the present invention provide labels for traceability and identification that can be applied to a diverse number of applications. For example, embodiments of the present invention can be applied to products including mechanical parts, plastic and polymer goods, food and medicine, medical devices, consumer goods, and glass-based technologies (such as in the wine bottle industry, etc.). Embodiments of the present invention may be used for identification, authenticity verification, supply chain management, and automated purchasing and check-out of products. Embodiments of the present invention provide Nano-Electro-Mechanical-System (NEMS) each with a unique acoustic signature and serving as a non-clonable code that can be read through wireless spectral interrogation. Therefore, an Acoustic NEMS Label (ANL) according to an embodiment of the present invention may enable high levels of immunity to counterfeit and tampering for a wide range of products.

Embodiments of the present invention utilize low acoustic/mechanical dissipation of solids to form high quality-factor (Q) resonance peaks representative of the encode data, thereby enabling low power and contactless read-out of the encoded data with a high signal-to-noise ratio. Therefore, unlike other conventional systems, such as RFIDs, embodiments of the present invention lend themselves to substantial miniaturization while sustaining their high Q.

By relying on mechanical resonance modes, embodiments of the present invention may be used with a diverse and wide variety of materials, such as metals, semiconductors, and insulators, regardless of their electrical properties. Furthermore, through suitable selection of the materials, embodiments of the present invention are difficult to remove or alter.

Physically coded acoustic vibration patterns with distinct frequencies are created, in accordance with embodiments of the present invention, by forming an array of nanodots on a substrate with sub-micrometer dimensions. Such a device may be integrated with a thin-film piezoelectric electromechanical transducer. The resulting NEMS provides a unique acoustic signature. Therefore, embodiments of the present invention benefit from the nanometer precision of existing fabrication technologies to generate reproducible patterns, while inducing uncertainty in the dimensions of the individual nanodots in a controlled manner to create variability.

Embodiments of the present invention thus may include a first group of nanodots that are well-defined and reproducible to form a watermark, and a second group of nanodots that are randomized to form a fingerprint. Embodiments of the present invention are thus highly immune to cloning as mechanical or chemical removal and reapplication of the nanodots results in an irreversible physical damage.

Some embodiments of the present invention include a biodegradable zinc-oxide nano-film as a piezoelectric transducer of acoustic patterns and thus are used in medical or food products, where the limitations imposed by bio-compatibility requirements make the development of authentication procedures challenging.

BRIEF DESCRIPTION OF DRAWINGS

FIG. 4 shows the acoustic signature of the pattern of nanodots shown in FIG. 1A for three different nanodot diameter sizes, in accordance with one embodiment of the present invention.

FIGS. 5A, 5B, 5C and 5D are computer simulated images of the vibrational behavior of the pattern of nanodots shown in FIG. 1A at different resonance frequencies.

DETAILED DESCRIPTION OF THE INVENTION

Embodiments of the present invention encode data for identification and labeling by using a multitude of nano-electro-mechanical structures formed on a substrate. The number of such structures, their shapes, the spacing between them and their overall distribution pattern, in accordance with embodiments of the present invention, result in a vibrational pattern (also referred to herein as a resonance mode or an acoustic signature) that uniquely identifies the collection of the structures and the encoded data they represent.

Figure 1A:
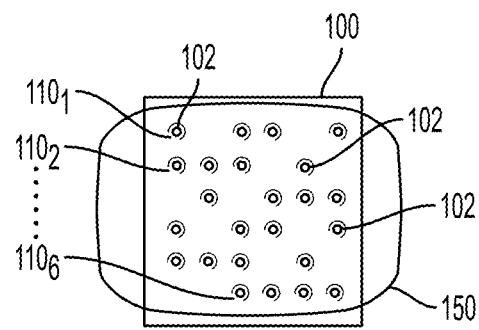
FIG. 1A is a simplified top view of a pattern of nanodots used to encode data, in accordance with one exemplary embodiment of the present invention.
Figure 1B:
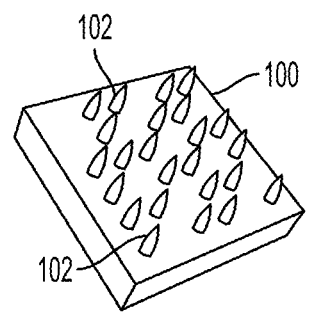
FIG. 1B is a perspective view of the pattern of nanodots of FIG. 1A, in accordance with one embodiment of the present invention.

FIG. 1A is a simplified top view of a multitude of nanodots (alternatively referred to herein as nanodots) 102 formed on substrate 100, in accordance with one exemplary embodiment of the present invention. FIG. 1B is a perspective view of substrate 100 as well as nanodots 102 formed thereon. In FIGS. 1A and 1B, 24 such nanodots are shown as being arranged along 6 rows, namely rows $110_1$, $110_2 \ldots 110_6$. It is understood, however, that a data encoder, in accordance with embodiments of the present invention, may have any number of nanodots forming any number of regular, irregular or arbitrary patterns. It is also understood, that the distance between any two nanodots, adjacent or otherwise, may be selected either at random or according to a predefined spacing scheme. Nanodots 102 may have a cylindrical, rectangular, square, stripe, tapered or other shapes. In the following, a multitude of nanodots, such as those shown in FIG. 1A and defined by a unique acoustic signature, are alternatively referred to as a data pattern or pattern. The data pattern defined by nanodots 102 of FIG. 1A is identified using reference number 150.

In accordance with one aspect of the present invention, the acoustic signature of pattern 150 is used to encode data represented by pattern 150. For example, the acoustic signature associated with pattern 150 may be used to encode, e.g., binary data "101". In other words, to encode, for example, binary data "101", pattern 150 is formed on substrate 100.

In accordance with some embodiments of the present invention, a pattern includes at least two parts each defined by a subset of the nanodots disposed in the pattern. A first subset of each such pattern, also referred to herein as watermark, represents a non-changing and constant value that is reproducible and not subject to statistical process variations used to manufacture the pattern. The second subset of each such pattern, referred to herein as fingerprint, is formed using geometrical dimensions smaller than the processing node used in their manufacture. The fingerprint of each pattern thus lends itself to statistical process variations or lithographical uncertainties inherent in the manufacturing process and is thus substantially non-reproducible. In other words, the fingerprint of each pattern is designed so as to be susceptible to processing variations and therefore unique to each physical part/device that includes the pattern.

Figure 2:
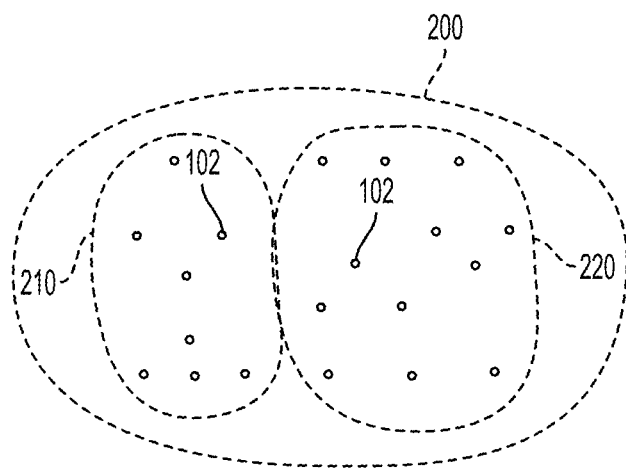
FIG. 2 is an exemplary pattern of nanodots, in accordance with another embodiment of the present invention.

FIG. 2 is an exemplary pattern 200 shown as including a watermark sub-pattern 220 and a fingerprint sub-pattern 210. Assume pattern 200 is formed on a semiconductor substrate using a 20 nm processing node/technology. To ensure repeatability and reproducibility, watermark 220 is formed in accordance with the design rules defined by the processing technology. Therefore, watermark 220 is adapted not to change from one wafer to another wafer, or across any given wafer considered not defective or otherwise suffering from yield loss. Fingerprint 210 however is formed using design rules that do not fully conform to those prescribed by the manufacturing process. For example, fingerprint 210 may be manufactured using spacing rules that are shorter than 20 nm thus causing the spacing between each pair of nanodots 102, or the heights of nanodots 102, to differ from one manufactured part to another, due to statistical variations inherent in the manufacturing process. Therefore, whereas the watermark sub-pattern of any given pattern remains the same from one manufactured part to another, the fingerprint sub-pattern of the pattern is designed to vary from one manufactured part to the next.

Figure 3:
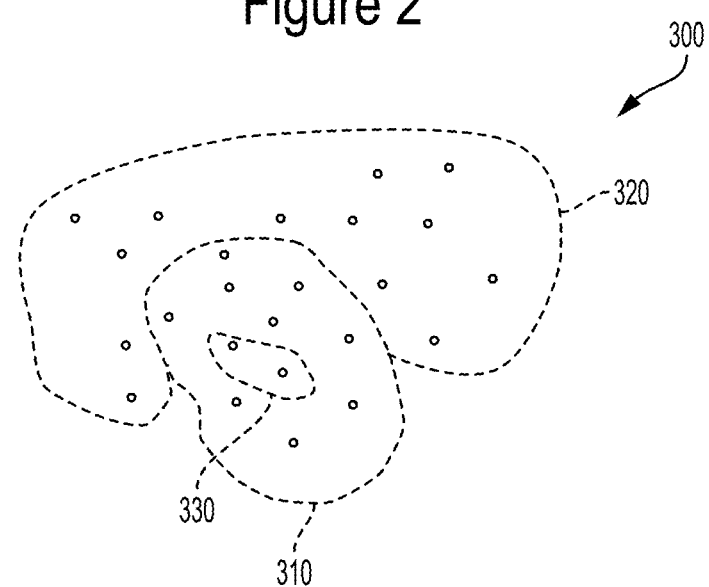
FIG. 3 is an exemplary pattern of nanodots, in accordance with another embodiment of the present invention.

FIG. 3 is an exemplary pattern 300, in accordance with another exemplary embodiment of the present invention. Pattern 300 is shown as including a watermark sub-pattern defined by the nanodots disposed in regions 320 and 330, and a fingerprint sub-pattern defined by the nanodots disposed in region 330 other than the nanodots disposed in region 330. Therefore, in some embodiments, the watermark or the fingerprint portions of a pattern may not be represented by nanodots disposed in continuous regions.

Furthermore, in some embodiments, different nanodots may have different physical characteristics. For example, nanodots formed near the periphery or outer regions of a pattern may have a different height, diameter, or shape than the nanodots formed near the inner regions of the pattern, thereby to enable more degree of variability in the acoustic signature of the pattern.

FIG. 4 shows the acoustic frequency characteristic (acoustic signature) of the pattern shown in FIG. 1A for three different nanodots 102 diameter sizes. Plots 160, 170, and 180 respectively show the acoustic frequency characteristic of pattern 160 of FIG. 1A when the diameter of nanodots 102 is selected to be 9 nm, 10 nm, and 11 nm respectively. Each such plot shows four distinct resonance modes. The resonance modes that form the acoustic signature are a result of the interaction of surface or bulk acoustic waves propagating in the nanodots and the substrate and interacting upon reflection and dispersion at their physical boundaries.

As is seen from FIG. 4, by changing the size of the nanodots, such as their diameter, the acoustic signature of the pattern may be varied. Although not shown, it is understood that by changing other characteristics of nanodots 102, such as their heights, or changing the pattern of the nanodots, a different acoustic signature is achieved, in accordance with embodiments of the present invention.

FIGS. 5A, 5B, 5C and 5D are computer simulated images of the vibrational behavior of pattern 150 at different frequencies. The white regions in FIGS. 5A-5D represent vibrations along the z-axis and away from the plane of the nanodots and the black regions represent vibrations along the z-axis and toward the plane of the nanodots. As is seen from 5A-5D, a pattern of nanodots may exhibit different vibrational characteristics and resonance modes at different frequencies.

Because a pattern representing an encoded data, in accordance with embodiments of the present invention, is formed using nanodots whose dimensions are in the nanometer range, the nanodots are not visible to the naked eye. Furthermore, when the pattern is formed on a transparent substrate, such as glass, the substrate and the pattern of nanodots representing an encoded data, is invisible to the naked eye. Therefore, a substrate encoded using a pattern of nanodots formed in accordance with embodiments of the present invention, may replace barcodes and other similar tags or identifiers while being transparent, tamper-proof and irremovable.

A pattern of nanodots, in accordance with embodiments of the present invention, may be activated to generate an acoustic signature using any number of different techniques. For example, in one embodiment, the nanodots may be caused to vibrate by applying an electrical signal to piezoelectric material covering the nanodots. The EM waves have a frequency spectrum containing the resonance modes of interest in the pattern's spectral signature.

In another embodiment, electromagnetic (EM) waves may be used to cause the nanodots to vibrate. In such embodiment, an antenna formed on the same device that includes the nanodots receives the EM waves. The EM waves are subsequently converted to acoustic energy to cause vibration. The EM waves are transmitted at a frequency spectrum that contains the resonance modes of interest in the pattern's spectral signature. Such a signal may be a periodic pulse train with a proper frequency bandwidth, which translates into a sync function covering the spectral signature of the pattern. The wideband EM waves excite the resonance modes in the pattern corresponding to the spectral content of the reflected EM wave with the stored code. The frequency domain interrogation of the signal reflection, through a network analyzer, reveals the code. In yet another embodiment, the device that includes the nanodots may be, for example, tapped to cause vibration.

The acoustic signature generated by a pattern of nanodots, in accordance with embodiments of the present invention, may be read using any number of different techniques such as contactless acoustic, optical and RF systems. For example, in one embodiment, the acoustic vibration of the nanodots may be converted to EM energy and transmitted using EM waves. An EM reader external to the device in which the nanodots are formed would receive the EM waves to generate the acoustic signature of the nanodots to decode the encoded data. In another embodiment, the readout of the acoustic signature of the nanodots may be carried out using conductive probes disposed on the device in which the nanodots are formed. In yet another embodiment, the acoustic signature may be measured by an optical reader.

Considering the significantly larger wavelength of the EM signal compared to the pattern dimensions, a wireless reader is independent of the relative placement or distance from the scanning hardware and the barcode. Therefore, there is no need to know or identify the location of the nanodots on the product when using such readers.

In an alternative read-out mechanism, the excited mechanical and acoustic resonance patterns can be interrogated through a contact-less acoustic or holographic microscope to extract the spectral signature of the pattern of nanodots. In an acoustic and holographic microscopy approach, the pattern should be properly placed in the line-of-sight for accurate readout.

As described above, either EM energy in the form of EM waves (such as radio-frequency waves) or mechanical energy in the form of compressional waves (e.g., audible waves) can be used to excite and read the pattern of nanodots. If using acoustic waves, the frequencies can be above, below, or within the band of frequencies that humans can detect. Piezoelectric and IDT layers, as described further below, may not be required for compressional wave readout schemes, but may be advantageous when using EM readout schemes. In other words, the piezoelectric layers and IDT layers can directly interact with the EM waves, turning the EM energy into acoustic energy and mechanically resonating the nanodots.

Figure 6A:
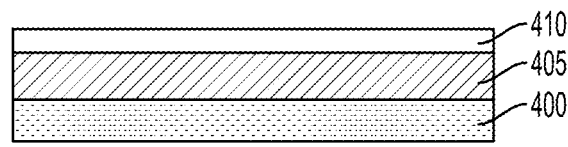
FIGS. 6A-6E are cross-sectional views of a device as it undergoes a number of processing steps to form a pattern of nanodots thereon, in accordance with one embodiment of the present invention.
Figure 6B:
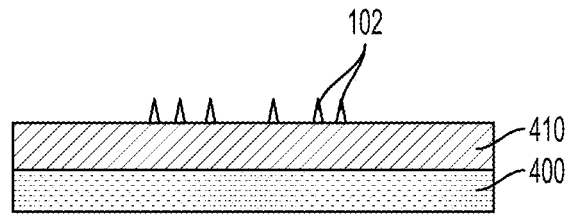
Figure 6C:
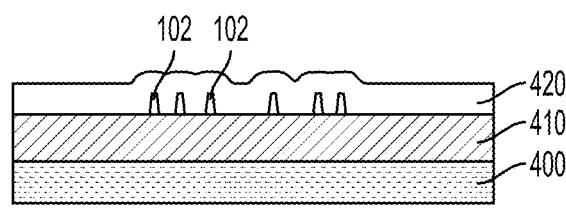
Figure 6D:
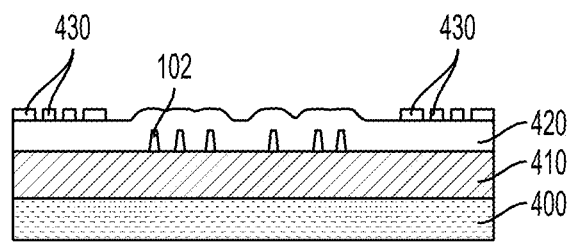
Figure 6E:
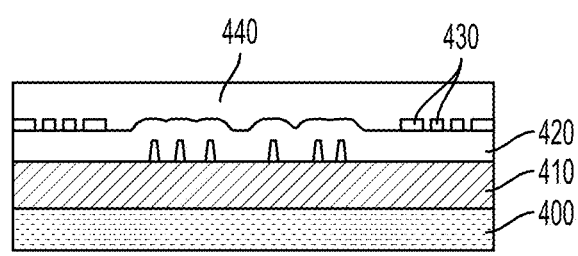

FIGS. 6A-6E are cross-sectional views of a device as it undergoes a number of processing steps to form a pattern of nanodots thereon, in accordance with one embodiment of the present invention. Referring to FIG. 6A, a layer of polymer (such as polyethersulfone (PES) or any other biocompatible/biodegradable polymer) 405 is deposited on substrate 400 to serve as the pattern transfer layer. Substrate 400 may be, for example, a silicon or a silicon dioxide substrate. A layer 410 of metal, such as gold, is then deposited on polymer layer 405 to form the device structure shown in FIG. 6A. Next, as shown in 6B, metal layer 410 is patterned and etched to form nanodots 102. Next, as shown in FIG. 6C, a layer 420 of piezoelectric material, such as zinc oxide, is deposited (using, for example, sputtering) on the device structure of FIG. 6B. Thereafter, as shown in FIG. 6D, a second layer of metal is deposited, patterned and etched to form interdigital transducer (IDT) metal structures 430 for wireless excitation of surface/bulk acoustic waves. Next, as shown in FIG. 6E, a layer of passivation 440 is deposited to cover the entire structure of FIG. 6D to protect the pattern of nanodots from environmental perturbations, such as humidity, electrical charge, and the like. In one example, the device fabricated as shown in FIG. 6E may have a dimension of 50 µm×50 µm.

Figure 7A:
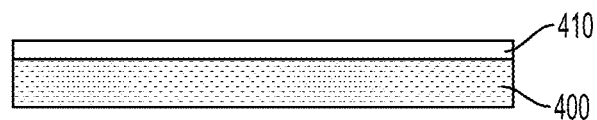
FIGS. 7A-7E are cross-sectional views of a device as it undergoes a number of processing steps to form a pattern of nanodots thereon, in accordance with one embodiment of the present invention.
Figure 7B:
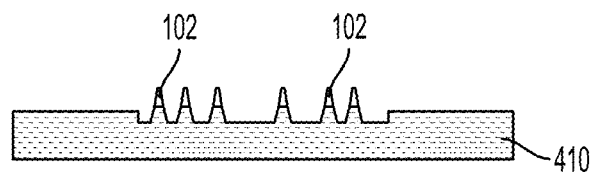
Figure 7C:
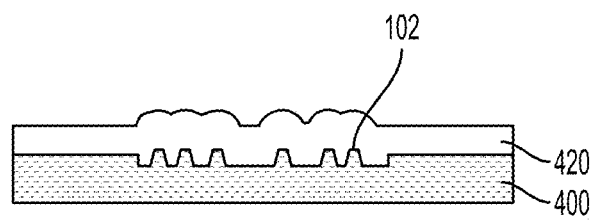
Figure 7D:
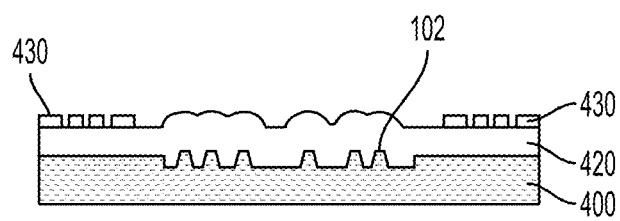
Figure 7E:
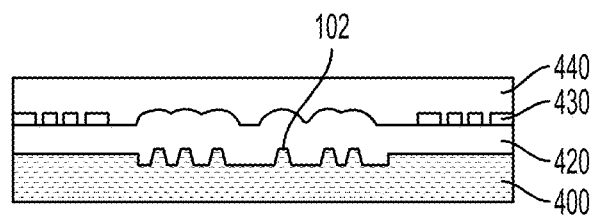

FIGS. 7A-7E are cross-sectional views of a device as it undergoes a number of processing steps to form a pattern of nanodots thereon, in accordance with one embodiment of the present invention. Referring to FIG. 7A, a layer 410 of metal is deposited on substrate 400 which may be, for example, a silicon or silicon dioxide substrate. Next, as shown in 7B, metal layer 410 is patterned and etched to form nanodots 102. Next, as shown in FIG. 7C, the metal layer portion 410 of the nanodots is etched away so that the nanodots include only the substrate material. A layer 420 of piezoelectric material is then deposited on the resulting structure. Thereafter, as shown in FIG. 7D, a second layer of metal is deposited, patterned and etched to form interdigital transducer metal structures 430. Next, as shown in FIG. 7E, a layer of passivation 440 is deposited to cover the entire structure shown in FIG. 7D.

The above embodiments of the present invention are illustrative and not limitative. The embodiments of the present invention are not limited by the number, shape or pattern of nanodots. The above embodiments of the present invention are not limited by the wavelength or frequency of the EM or acoustic signals. Other modifications and variations will be apparent to those skilled in the art and are intended to fall within the scope of the appended claims.

What is claimed is:

1. A device comprising:
    a substrate;
    a plurality of structures patterned on the substrate;
    a piezoelectric layer disposed on the plurality of structures; and
    an interdigital transducer layer formed above the piezoelectric layer;
    wherein a first subset of the plurality of structures is formed in conformity with patterning rules of a fabrication process used to manufacture the device, and wherein a second subset of the plurality of structures is formed in violation of the patterning rules such that the second subset of the plurality of structures exhibits a larger variation in patterning than a variation of the first subset of the plurality of structures.

2. The device of claim 1 wherein each of the plurality of structures has a cylindrical shape.

3. The device of claim 1 wherein each of the plurality of structures has a rectangular shape.

4. The device of claim 1 wherein said first and second subsets have overlapping regions.

5. The device of claim 1 wherein said first and second subsets do not have overlapping regions.

6. The device of claim 1 wherein a first group of the first subset has a different height than a second group of the first subset.

7. The device of claim 1 wherein a first group of the first subset has a different shape than a second group of the first subset.

8. The device of claim 1,
wherein the piezoelectric layer is adapted to cause the plurality of structures to vibrate in response to an electrical signal.

9. The device of claim 8,
wherein the interdigital transducer layer is adapted to generate acoustic waves.

10. The device of claim 1 wherein said plurality of structures are formed from metal.

11. The device of claim 1 wherein said plurality of structures are from a same material as the substrate.

12. The device of claim 1 wherein said substrate is a semiconductor substrate.

13. The device of claim 11 wherein said substrate is a silicon dioxide substrate.

14. The device of claim 13 further comprising a piezoelectric layer formed from Aluminum Nitride.

15. The device of claim 1 wherein each of said plurality of structures has a dimension in the range of 1 nm to 1 μm.

16. A method of encoding data comprising:
forming a first plurality of structures on a substrate, wherein the first plurality of structures is fabricated in conformity with patterning rules of a fabrication process; and
forming a second plurality of structures in violation of the patterning rules such that the second plurality of structures exhibits a larger variation in patterning than a variation of the first plurality of structures;
wherein an acoustic signature of the first plurality of structures represents a first portion of encoded data, and wherein an acoustic signature of the second plurality of structures represents a second portion of the encoded data.

17. The method of claim 16 wherein at least a subset of the first plurality of structures has a cylindrical shape.

18. The method of claim 16 wherein at least a subset of the first plurality of structures has a rectangular shape.

19. The method of claim 16 wherein said first and second plurality of structures are formed in non-overlapping regions.

20. The method of claim 16 wherein a first group of the first plurality of structures has a different height than a second group of the first plurality of structures.

21. The method of claim 16 wherein a first group of the first plurality of structures has a different shape than a second group of the first plurality of structures.

22. The method of claim 16 further comprising:
forming a piezoelectric layer above the first and second plurality of structures.

23. The method of claim 22 further comprising:
forming an interdigital transducer layer above the piezoelectric layer.

24. The method of claim 16 wherein said first and second plurality of structures are formed from metal.

25. The method of claim 16 wherein said first and second plurality of structures are from a same material as the substrate.

26. The method of claim 16 wherein said substrate is a semiconductor substrate.

27. The method of claim 25 wherein said substrate is a silicon dioxide substrate.

28. The method of claim 27 further comprising:
forming a piezoelectric layer made from Aluminum nitride.

29. The method of claim 16 wherein each of said first and second plurality of structures has a dimension in the range of 1 nm to 1 μm.

* * * * *